(12) United States Patent
Yu

(10) Patent No.: US 7,772,608 B2
(45) Date of Patent: Aug. 10, 2010

(54) PHOTOELECTRIC ELEMENT PACKAGE WITH TEMPERATURE COMPENSATION

(75) Inventor: Wen-Ping Yu, Taipei County (TW)

(73) Assignee: Amtran Technology Co., Ltd., Taipei (TW)

( * ) Notice: Subject to any disclaimer, the term of this patent is extended or adjusted under 35 U.S.C. 154(b) by 497 days.

(21) Appl. No.: 11/878,561

(22) Filed: Jul. 25, 2007

(65) Prior Publication Data
US 2008/0251795 A1  Oct. 16, 2008

(30) Foreign Application Priority Data
Apr. 13, 2007  (TW) .............................. 96113138 A

(51) Int. Cl.
*H01L 33/00* (2010.01)
(52) U.S. Cl. ............................. 257/98; 257/99; 257/433
(58) Field of Classification Search ........... 257/87–103, 257/431–435, E33.072
See application file for complete search history.

(56) References Cited

U.S. PATENT DOCUMENTS

| | | | | |
|---|---|---|---|---|
| 7,227,236 B1 * | 6/2007 | Lee et al. | ....................... | 257/98 |
| 7,408,205 B2 * | 8/2008 | Webster et al. | ................. | 257/99 |
| 7,410,306 B2 * | 8/2008 | Wipiejewski | ................. | 257/98 |
| 2007/0053392 A1 | 3/2007 | Moto | | |

FOREIGN PATENT DOCUMENTS

CN  2826459 Y  10/2006

* cited by examiner

*Primary Examiner*—Cuong Q Nguyen
(74) *Attorney, Agent, or Firm*—Birch, Stewart, Kolasch & Birch, LLP

(57) ABSTRACT

A photoelectric element package with temperature compensation includes a substrate, and a first light-emitting element, a second light-emitting element, a photosensitive element, and a drive element disposed on the substrate, all of which are disposed in an internal space formed by a first casing joined with a second casing. Alternatively, the second light-emitting element and the photosensitive element are disposed in an internal space of a third casing. By adding the second light-emitting element, the photosensitive element can sense the light emitting intensity accurately in the absence of other interferences, so as to feed back the current operating state of the light-emitting element. A temperature compensation function is achieved by a laser driver, so as to reduce the influence of temperature on the light-emitting element, such that the light-emitting element emits light in an accurate intensity.

10 Claims, 3 Drawing Sheets

PHOTOELECTRIC ELEMENT PACKAGE WITH TEMPERATURE COMPENSATION

CROSS-REFERENCE TO RELATED APPLICATIONS

This non-provisional application claims priority under 35 U.S.C. §119(a) on Patent Application No(s). 096113138 filed in Taiwan, R.O.C. on Apr. 13, 2007, the entire contents of which are hereby incorporated by reference.

BACKGROUND OF THE INVENTION

1. Field of Invention

The present invention relates to a photoelectric element package with temperature compensation. More particularly, the present invention relates to a photoelectric element package with temperature compensation without a header.

2. Related Art

A photoelectric element disclosed in the conventional art is shown in FIGS. 1A-1C. As shown in FIG. 1A, the photoelectric element is mainly constituted by a casing 101 and a header 102, and the casing 101 is fitted on the header 102. In sake of air-tightness required on the conventional photoelectric element package, a process using metal and glass together is adopted in the structure of the header design, such that metal pins can be fixed on the header 102. The metal pins are further connected to a printed circuit board (PCB), such that the electronic elements on the PCB are electrically communicated with the photoelectric element.

As shown in FIG. 1C, a light-emitting element integrated by a laser diode 107 and a photo diode 108 is disposed in a space enclosed by the metal pins above the header, and the photo diode 108 is used to sense the light emitting intensity of the laser diode 107. After the laser diode 107 and the photo diode 108 are soldered to the metal pins above the header by a gold wire, and after the metal pins below the header are connected to an external circuit, electronic signals are transmitted as optical signals through the operation of the photoelectric element.

The space enclosed by the metal pins above the header is limited, and the size of the photo diode 108 is usually larger than that of the laser diode 107, therefore, the size of the header is increased by disposing the laser diode 107, the photo diode 108, and other relevant circuit elements in the limited space. As shown in FIG. 1B, a header 104 has eight pins, and a header 106 shown in FIG. 1C has ten pins. As the size of the header becomes larger, the size of a casing 103 and a casing 105 is also increased, which goes against the miniaturizing development trend of the consumptive products recently.

Furthermore, the conventional art is confronted with the problem in temperature compensation. As shown in FIG. 1A to FIG. 1C, when the photoelectric element is applied in a one-way transmission, the light emitted by the laser diode 107 may be dispersed, and thus the photo diode 108 may not receive the light emitting intensity of a correct ratio. Likewise, when being applied in a dual-way transmission, the light emitting intensity received by the photo diode 108 may include the light emitted by the laser diode 107 and another incident light. Therefore, when the reflected light can not be received correctly, an error may be generated or the compensation cannot be performed correctly if it is intended to perform compensation with the light emitting intensity sensed by the photo diode 108, thereby affecting the transmitted signal intensity.

The further problem lies in energy attenuation of the laser chip caused by the temperature. Therefore, the light emitting intensity of the laser diode 107 decreases as the temperature rises, such that the photo diode 108 senses a weakened intensity, the compensation circuit or the drive circuit may further increase the power of the laser diode 107 so as to increase the light emitting intensity of the laser diode 107, such that the transmitted light signal cannot indicate the actual situation and an error is further generated.

SUMMARY OF THE INVENTION

The present invention is directed to providing a photoelectric element package with temperature compensation.

The photoelectric element package with temperature compensation disclosed in an embodiment of the present invention includes a substrate; a first light-emitting element disposed at a first position of the substrate; a second light-emitting element disposed at a second position of the substrate; a drive element used for driving the first light-emitting element and the second light-emitting element to emit light; and a photosensitive element disposed adjacent to the second light-emitting element for sensing light emitting intensity of the second light-emitting element; a first casing fixed on the substrate and having an internal space and a first header; a second casing having a second header, a collar, and a lens, in which the second header is joined with the first header, the collar is used to carry an external element, and the lens is disposed at the bottom of the collar of the second casing for transmitting the light emitted by the first light-emitting element.

According to the embodiment of the present invention, the first position and the second position are located in the internal space of the first casing.

According to the embodiment of the present invention, the package further includes a third casing fixed on the substrate and having an internal space, and the second position is located in the internal space of the third casing.

The photoelectric element package with temperature compensation disclosed in another embodiment of the present invention includes a substrate; a first light-emitting element disposed at a first position of the substrate; a second light-emitting element disposed at a second position of the substrate; a drive element used for driving the first light-emitting element and the second light-emitting element to emit light; a photosensitive element disposed adjacent to the second light-emitting element for sensing light emitting intensity of the second light-emitting element; and a casing fixed on the substrate and having an internal space, a collar, and a lens, in which the collar is used to carry an external element, the lens is disposed at the bottom of the collar of the casing for transmitting the light emitted by the first light-emitting element.

According to another embodiment of the present invention, the first position and the second position are located in the internal space of the casing.

According to another embodiment of the present invention, the package further includes a second casing fixed on the substrate and having an internal space, and the second position is located in the internal space of the second casing.

According to the embodiment of the present invention, the first light-emitting element and the second light-emitting element are selected from the laser diodes produced by the same wafer, and have similar photoelectric characteristic under a variable temperature due to the similar semiconductor photoelectric characteristic.

According to the embodiment disclosed in the present invention, a set of feedback system, i.e., the second light-emitting element and the photosensitive element, is disposed, and the second light-emitting element and the photosensitive element are used to sense and feed back the current operating state of the first light-emitting element, meanwhile a laser driver is selected to achieve a feedback system with temperature compensation, so as to reduce the influence of temperature on the light emitting device, such that the light-emitting element emits light in an accurate intensity.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The detailed features and advantages of the present invention are illustrated in the detailed description hereinafter, which is sufficient for persons skilled in the art to known the technical content of the present invention and implement thereby. Moreover, according to the content disclosed in the specification, claims and figures, any persons skilled in the art can understand the objectives and advantages of the present invention easily. The following embodiments are given for further explaining the views of the present invention in detail, but not for limiting the scope of the present invention with any views.

Figure 1C:
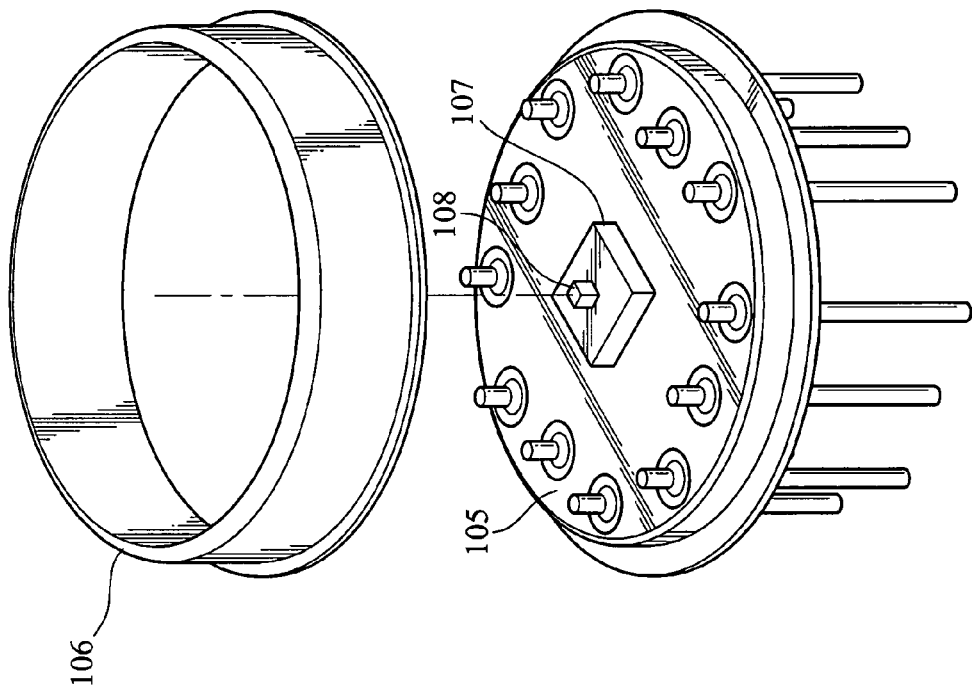
FIGS. 1A-1C are schematic views of a photoelectric element package according to the conventional art.
Figure 1B:
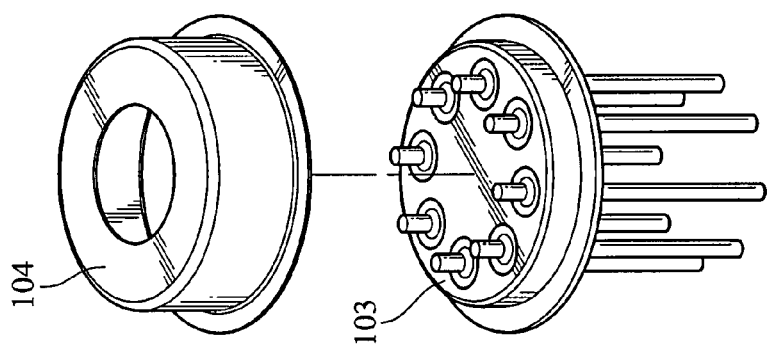
Figure 1A:
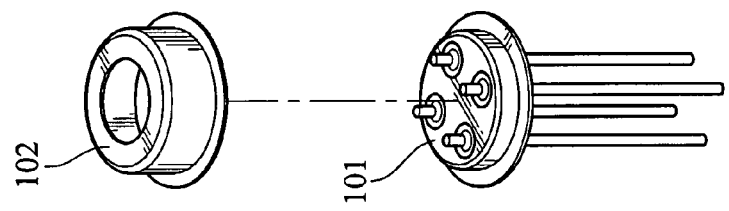
Figure 2:
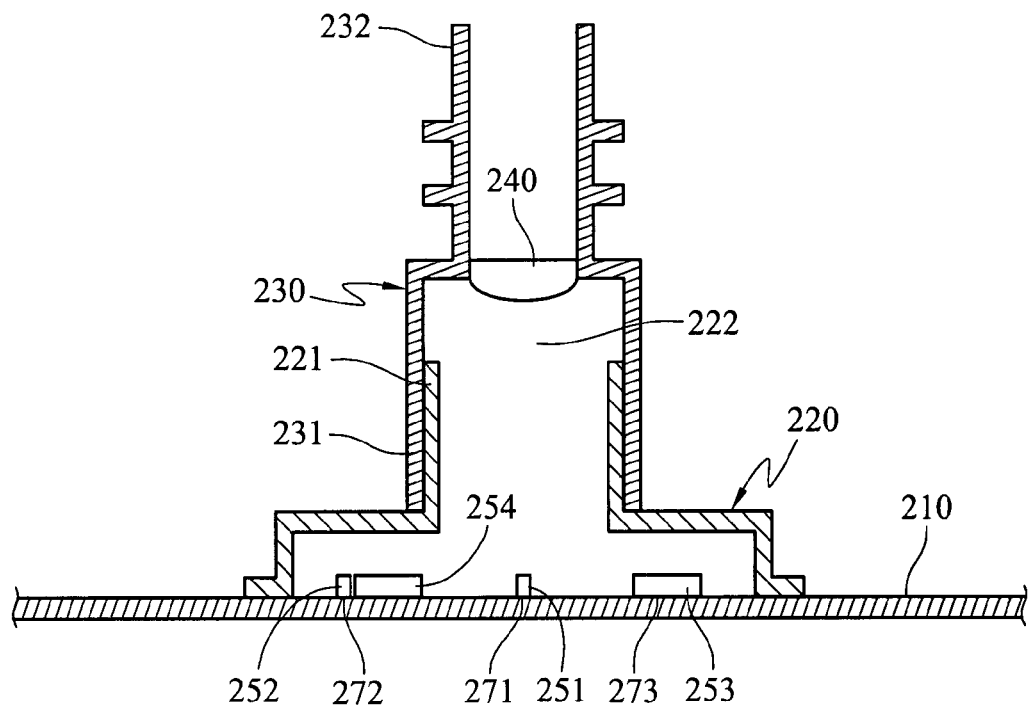
FIG. 2 is a schematic view of a photoelectric element package according to a first embodiment of the present invention.

Referring to FIG. 2, a schematic view of a photoelectric element package with temperature compensation according to a first embodiment of the present invention is shown. As shown in FIG. 2, the photoelectric element package includes a substrate 210, a first casing 220, a second casing 230, a lens 240, a first light-emitting element 251, a second light-emitting element 252, a drive element 253, and a photosensitive element 254.

The substrate 210 is usually a printed circuit board. (PCB) carrying circuit elements for processing and operating electronic signals.

The first casing 220 is fixed on the substrate 210 usually by means of bonding. Certainly, depending on different materials and functions of the casing, the casing can also be fixed on the substrate by means of soldering. The first casing 220 has a first header 221 and an internal space 222.

The second casing 230 has a second header 231 and a collar 232. The second header 231 of the second casing 230 is jointed with the first header 221. In the first embodiment, the first casing 220 and the second casing 230 are hollow column-shaped, and can also be other hollow structures. In this embodiment, the first casing 220 and the second casing 230 are joined by means of bonding or soldering. Other joining manners can also be adopted, such as a swiveling or an engaging manner.

The second casing 230 has a collar 232 for carrying an optical fiber (not shown). The lens 240 is disposed at the bottom of the collar 232 of the second casing 230 for transmitting the light emitted by the first light-emitting element 251, such that the optical fiber fixed in the collar 232 transmits the light emitted by the first light-emitting element 251 to a remote apparatus. The wavelength and other features of the light-emitting element should be taken into account when selecting a size and a curvature of the lens, so as to correctly transmit the light into the optical fiber.

A first light-emitting element 251, a second light-emitting element 252, a drive element 253, and a photosensitive element 254 are disposed on the substrate 210. The first light-emitting element 251, the second light-emitting element 252, the drive element 253, and the photosensitive element 254 are all disposed in the internal space 220 of the first casing 222. In an embodiment, the first light-emitting element 251 and the second light-emitting element 252 are laser diodes. In an embodiment, the drive element 253 is a drive chip for driving the laser diodes. The photosensitive element 254 is a photo diode.

The first light-emitting element 251 is disposed at a first position 271 on the substrate 210, and the first position 271 is located in the internal space 222 of the first casing 220, such that the light emitted by the first light-emitting element 251 is not blocked by the inner wall of the first casing 220 from being transmitted to the external element. The second light-emitting element 252 is disposed at a second position 272 different from the first position 271 on the substrate 210, and the second position 272 is also located in the internal space 222 of the first casing 220. The second light-emitting element 252 is an element only used for emitting light, but not for transmitting light signals. The light emitted by the second light-emitting element 252 disposed at the second position 272 is blocked by the inner wall of the first casing 220 and reflected to the photosensitive element 254 for sensing the light emitting intensity instead of being transmitted to the outside.

In this embodiment, the drive element 253 is disposed at a third position 273 on the substrate 210. In another embodiment, the drive element 253 is disposed at other position (not shown) on the substrate 210, which is not located in the internal space 222 of the first casing 220. The drive element 253 is controlled by an electrical signal to drive the first light-emitting element 251 and the second light-emitting element 252 to emit light. The first light-emitting element 251 and the second light-emitting element 252 are selected from the laser diodes produced by the same wafer, and have similar photoelectric characteristic under a variable temperature due to the similar semiconductor photoelectric characteristic.

Figure 3:
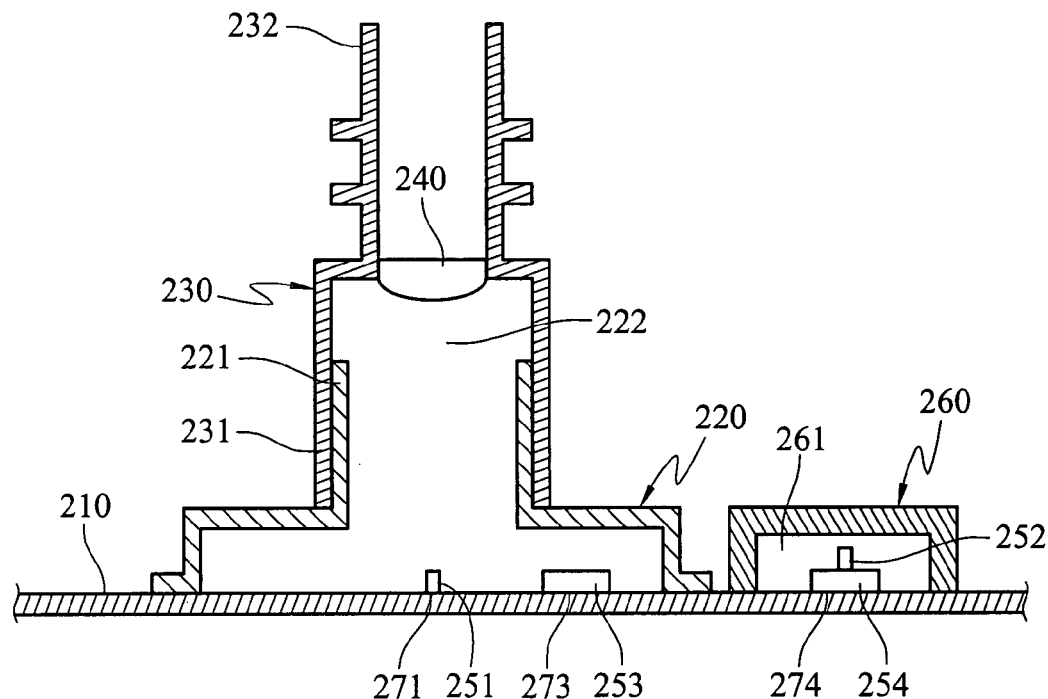
FIG. 3 is a schematic view of a photoelectric element package according to a second embodiment of the present invention.
Figure 4:
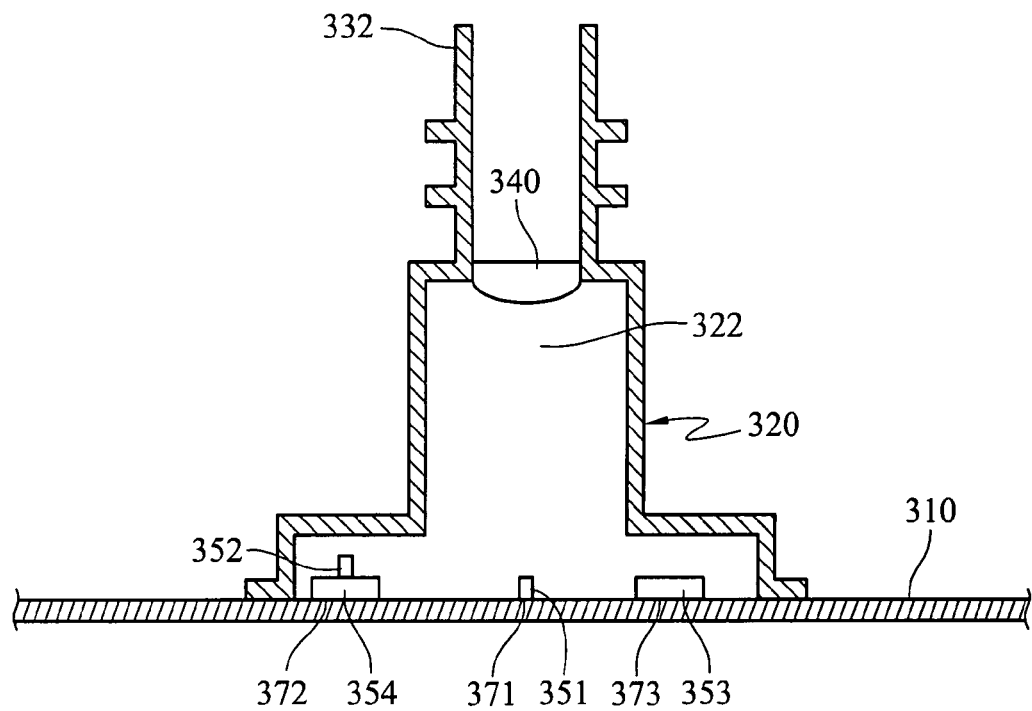
FIG. 4 is a schematic view of a photoelectric element package according to a third embodiment of the present invention.
Figure 5:
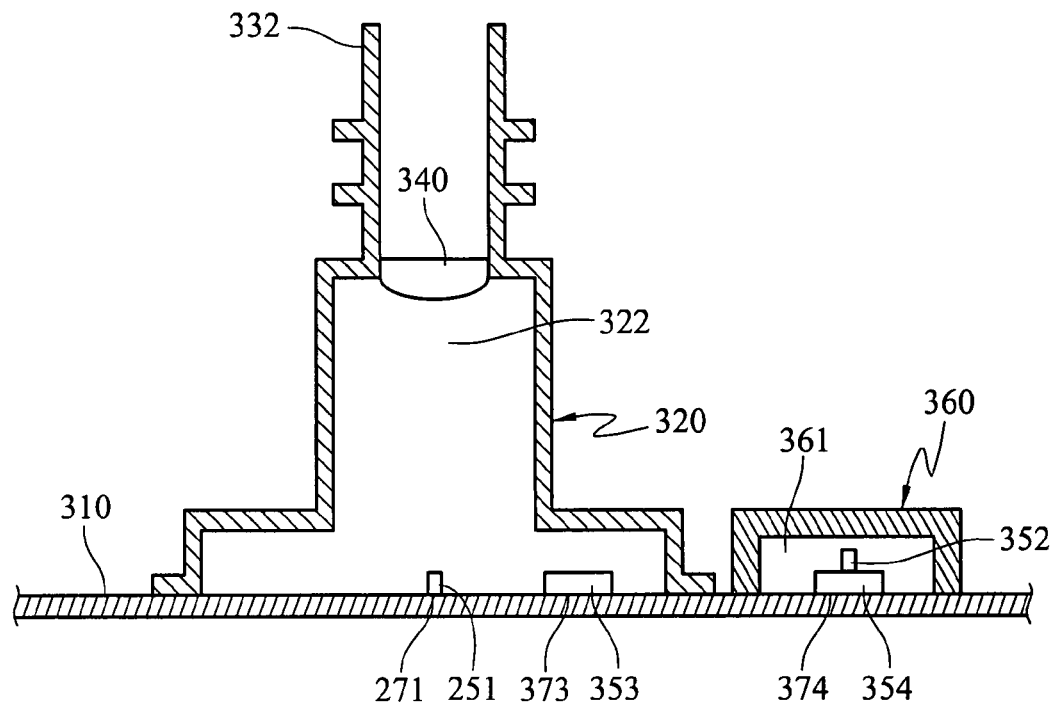
FIG. 5 is a schematic view of a photoelectric element package according to a fourth embodiment of the present invention.

In this embodiment, the photosensitive element 254 is disposed on one side of the second light-emitting element 252 and is adjacent to the second light-emitting element 252, and also can be disposed by means of stacking in another embodiment (such as the embodiments shown in FIGS. 3-5). The size of the photosensitive element 254 is larger than that of the second light-emitting element 252. Therefore, the photosensitive element 254 is used to sense the intensity of the light emitted by the second light-emitting element 252, so as to obtain the light emitting intensity of the first light-emitting element 251, and the sensed light emitting intensity is fed back to the drive element 253, such that the drive element 253 adjusts a drive current according to the sensed light emitting intensity so as to drive the first light-emitting element 251. According to the architecture, the second light-emitting element 252 and the photosensitive element 254 are used as a feedback module for feeding back whether the current operating state of the first light-emitting element 251 is normal or not.

FIG. 3 is a schematic view of a photoelectric element package according to a second embodiment of the present invention. The main elements and functions are similar to those in the first embodiment, and the difference lies in that a third casing 260 is added in the second embodiment.

The third casing 260 is fixed on the substrate 210 usually by means of bonding. Certainly, depending on different materials and functions of the casing, the casing can also be fixed on the substrate by means of soldering. The third casing 260 has an internal space 261, and the second light-emitting element 252 and the photosensitive element 254 are disposed on the portion of the substrate 210 in the internal space 261 of the third casing 260, i.e., at the second position 274 shown in FIG. 3. In this embodiment, the second light-emitting element 252 is stacked above the photosensitive element 254, and certainly, can also be arranged side by side.

FIG. 4 is a schematic view of a photoelectric element package according to a third embodiment of the present invention. As shown in FIG. 4, the photoelectric element package includes a substrate 310 and a casing 320.

The substrate 310 is usually a PCB carrying circuit elements for processing and operating electronic signals. The casing 320 is fixed on the substrate 310, and has an internal space 322. In an embodiment, the casing 320 is hollow column-shaped.

The casing 320 has a collar 232 for carrying an optical fiber (not shown). A lens 340 is disposed at the bottom of the collar 332 of the casing 320 for transmitting the light emitted by the light-emitting element 351, such that the optical fiber fixed in the collar 332 transmits the light emitted by the light-emitting element 351 to a remote apparatus.

A first light-emitting element 351, a second light-emitting element 352, a drive element 353, and a photosensitive element 354 are disposed on the substrate 310. The first light-emitting element 351, the second light-emitting element 352, the drive element 353, and the photosensitive element 354 are all disposed in the internal space 322 of the casing 320. In an embodiment, the first light-emitting element 351 and the second light-emitting element 352 are laser diodes, the drive element 353 is a drive chip used for driving laser diodes, and the photosensitive element 354 is a photo diode.

The first light-emitting element 351 is disposed at a first position 371 on the substrate 310, and the first position 371 is located in the internal space 322 of the casing 320, such that the light emitted by the first light-emitting element 351 is not blocked by the inner wall of the casing 320 from being transmitted to the external element. The second light-emitting element 352 is disposed at a second position 372 different from the first position on the substrate 310, and the second position 372 is also located in the internal space 322 of the casing 320. The second light-emitting element 352 is an element only used for emitting light, but not for transmitting light signals. The light emitted by the second light-emitting element 352 disposed at the second position 372 is blocked by the inner wall of the casing 320 and reflected to the photosensitive element 354, instead of being transmitted to the outside.

In this embodiment, the drive element 353 is disposed at a third position 373 on the substrate 310. In another embodiment, the drive element 353 is disposed at other position (not shown) on the substrate 310, which is not located in the internal space 322 of the casing 320. The drive element 353 is controlled by an electrical signal so as to drive the first light-emitting element 351 and the second light-emitting element 352 to emit light. The first light-emitting element 351 and the second light-emitting element 352 are selected from the laser diodes produced by the same wafer, and have similar photoelectric characteristic under a variable temperature due to the similar semiconductor photoelectric characteristic.

In this embodiment, the second light-emitting element 352 is stacked above the photosensitive element 354, and can also be arranged side by side in another embodiment. The size of the photosensitive element 354 is larger than that of the second light-emitting element 352. The photosensitive element 354 is used to sense the intensity of the light emitted by the second light-emitting element-352, so as to obtain the light emitting intensity of the first light-emitting element 351, and the sensed light emitting intensity is fed back to the drive element 353, such that the drive element 353 adjusts the drive current according to the sensed light intensity so as to drive the first light-emitting element 351. Based on the above, the second light-emitting element 352 and the photosensitive element 354 are used as a feedback module for feeding back whether the current operating state of the first light-emitting element 351 is normal or not.

FIG. 5 is a schematic view of a photoelectric element package according to a fourth embodiment of the present invention. The main elements and functions are similar to those in the third embodiment, and the difference lies in that a second casing 360 is added in the fourth embodiment.

The second casing 360 is fixed on the substrate 310 usually by means of bonding, and certainly can also be fixed on the substrate by means of soldering. The second casing 360 has an internal space 361, and the second light-emitting element 352 and the photosensitive element 354 are disposed in the internal space 361 of the third casing 360, i.e., at the second position 374 on the substrate.

According to the embodiment disclosed in the present invention, the characteristic of the laser diode is used, and the laser diodes produced by the same wafer are selected, and similar photoelectric characteristic under a variable temperature is provided due to the similar semiconductor photoelectric characteristic.

Based on the above, by adding the second light-emitting element, the photosensitive element can sense the light emitting intensity more accurately in the absence of other interferences, so as to feed back the current operating state of the light-emitting element through a feedback system. A temperature compensation function is achieved by a laser driver, so as to reduce the influence of temperature on the light emitting device, such that the light-emitting element emits light in an accurate intensity. On the contrary, only one light-emitting element is provided in the prior art, thus the photosensitive element cannot sense the light emitting intensity correctly, without mentioning the accuracy control when performing the subsequent temperature compensation.

Furthermore, in the present invention, the photoelectric elements are directly bonded and packaged on the circuit board, such that the complicated procedures are greatly reduced, and the desired circuit can be disposed on the circuit board according to the actual demand of the circuit, thereby improving the completeness and integrity of the system. Moreover, the structure disclosed in the present invention can be applied in the packaging process of a printed circuit board, thereby realizing an automatic production.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A photoelectric element package with temperature compensation, comprising:
   a substrate;
   a first light-emitting element, disposed at a first position of the substrate;
   a second light-emitting element, disposed at a second position of the substrate;
   a drive element, disposed on the substrate for driving the first light-emitting element and the second light-emitting element to emit light;
   a photosensitive element, disposed at the second position and adjacent to the second light-emitting element, for sensing light emitting intensity of the second light-emitting element; and
   a casing, fixed on the substrate, having an internal space, a collar, and a lens, wherein the collar is used to carry an external element, the lens is disposed at the bottom of the collar of the casing for transmitting the light emitted by the first light-emitting element to the external element.

2. The package as claimed in claim 1, wherein the first position and the second position are located in the internal space of the casing.

3. The package as claimed in claim 1, further comprising a second casing fixed on the substrate, wherein the second light-emitting element and the photosensitive element are located at the second position in the second casing.

4. The package as claimed in claim 1, wherein the first light-emitting element and the second light-emitting element are produced from the same wafer.

5. The package as claimed in claim 1, wherein the size of the photosensitive element is larger than that of the second light-emitting element, and the photosensitive element is stacked below the second light-emitting element.

6. A photoelectric element package with temperature compensation, comprising:
   a substrate;
   a first light-emitting element, disposed at a first position of the substrate;
   a second light-emitting element, disposed at a second position of the substrate;
   a drive element, disposed on the substrate for driving the first light-emitting element and the second light-emitting element to emit light;
   a photosensitive element, disposed at the second position and adjacent to the second light-emitting element, for sensing light emitting intensity of the second light-emitting element;
   a first casing, fixed on the substrate, and having an internal space and a first header; and
   a second casing, having a second header, a collar, and a lens, wherein the second header is joined with the first header, the collar is used to carry an external element, the lens is disposed at the bottom of the collar of the second casing for transmitting the light emitted by the first light-emitting element.

7. The package as claimed in claim 6, wherein the first position and the second position are located in the internal space of the first casing.

8. The package as claimed in claim 6, further comprising a third casing fixed on the substrate, wherein the second light-emitting element and the photosensitive element are located at the second position in the third casing.

9. The package as claimed in claim 6, wherein the first light-emitting element and the second light-emitting element are produced from the same wafer.

10. The package as claimed in claim 6, wherein the size of the photosensitive element is larger than that of the second light-emitting element, and the photosensitive element is stacked below the second light-emitting element.

* * * * *